United States Patent [19]

Atalar

[11] Patent Number: 4,706,048
[45] Date of Patent: Nov. 10, 1987

[54] WIDE-BAND MATCHING NETWORK FOR PIEZOELECTRIC TRANSDUCER

[75] Inventor: Abdullah Atalar, Ankara, Turkey

[73] Assignee: Ernst Leitz Wetzlar GmbH, Wetzlar, Fed. Rep. of Germany

[21] Appl. No.: 712,108

[22] Filed: Mar. 15, 1985

[30] Foreign Application Priority Data

Mar. 17, 1984 [DE] Fed. Rep. of Germany ....... 3409927

[51] Int. Cl.⁴ .................... H03H 7/38; H03H 9/15
[52] U.S. Cl. .................... 333/32; 333/186; 310/314; 310/317
[58] Field of Search ............ 333/32, 186–192; 310/318, 319, 311, 314, 316, 317; 331/107 A

[56] References Cited

U.S. PATENT DOCUMENTS

| | | | |
|---|---|---|---|
| 1,808,524 | 6/1931 | Byrnes | 333/187 |
| 2,916,657 | 10/1959 | True | 333/187 |
| 3,727,154 | 4/1973 | Dailing et al. | 333/191 |
| 3,868,595 | 2/1975 | Capps, Jr. et al. | 331/108 |
| 3,903,733 | 9/1975 | Murayama et al. | 310/319 X |
| 4,181,864 | 1/1980 | Etzold | 310/319 X |
| 4,224,586 | 9/1980 | Loving, Jr. et al. | 333/192 |
| 4,387,352 | 6/1983 | Routh | 333/32 |

OTHER PUBLICATIONS

Pennebaker, W. B., "Impedance Matching Circuit for RF Sputtering"; *IBM Technical Disclosure Bulletin;* vol. 19, No. 7; Dec. 1976, pp. 2809–2811.

Primary Examiner—Eugene R. LaRoche
Assistant Examiner—Benny Lee
Attorney, Agent, or Firm—Schwartz, Jeffery, Schwaab, Mack, Blumenthal & Evans

[57] ABSTRACT

Wide-band network for matching a signal-conducting line having a characteristic impedance of 50 ohms to a piezoelectric transmitter having a capacitance $C_o$ and a reactance $X_o$ for a center frequency $f_o$ of the frequency band to be transmitted. Various circuit arrangements and dimensioning rules for the circuit elements are specified as a function of the reactance $X_o$. The transmitter is a part of an acoustic lens arrangement.

5 Claims, 6 Drawing Figures $C_0; X_0 < 50\Omega$ $C_0; 50\Omega < X_0 < 250\Omega$ $C_0; X_0 > 250\Omega$

WIDE-BAND MATCHING NETWORK FOR PIEZOELECTRIC TRANSDUCER

BACKGROUND OF THE INVENTION

The present invention relates to a wide-band network for matching a signal-conducting line having a characteristic impedance of 50 ohms to a piezoelectric transmitter having a capacitance $C_o$ and a reactance $X_o$ for a center frequency $f_o$ of the frequency band to be transmitted.

Piezoelectric transmitters of this type are used especially in acoustical microscopy for converting high-frequency oscillations into ultrasonic waves and back again. They are mounted in direct acoustic contact on a second propagation medium, for example sapphire. Normally, they consist of a sputtered zinc oxide layer (ZnO) which is embedded between two metal layers, one of which is sputtered onto the sapphire. If then an electric field of a suitable frequency is built up between the metal layers, the ZnO layer generates an acoustic field. The thickness of the layer must be selected in accordance with the working frequency desired for the acoustical microscopy. Typical working frequencies are between 100 MHz and 2 GHz. The thickness of the ZnO layer is selected to be between $\lambda/4$ and $\lambda/2$ of the wavelength of the working frequency within the ZnO layer.

As far as the electric connection is concerned, such a transmitter essentially represents a capacitive impedance. Its equivalent circuit can be represented as a resistance $R_\Omega$ in series with a capacitance Chd o. Typical values for the resistance are about 1/10 of the reactance of the capacitor at the center of the frequency band to be transmitted if the Q of the transmitter is 10, the quality factor Q being defined as capacitor reactance divided by the resistance.

Direct coupling of the transmitter to a 50-ohm system would bring with it large power losses because of the large electric mismatch. For this reason, electric matching networks are used between the transmitter and the 50-ohm system which are usually optimized for a certain working frequency so that the matching applies only to a small range around this frequency. Therefore, the matching networks have only a limited bandwidth.

For applications covering a large range of bandwidths, it is desired to optimize the matching network over a larger range. This is generally successful only to the extent to which the number of matching elements is also increased. A theoretical upper limit for expanding the bandwidth is essentially determined by the Q of the transmitter.

The practical possibility of implementing the network is made more and more difficult as the number of components increases. For this reason, the effort is made for practical reasons to limit the number of matching elements.

For application in the field of acoustical microscopy, it must also be noted that the matching network is necessarily a part of the acoustical less arrangement. For image scanning, this lens must be moved in an oscillatory fashion. Thus, a need exists for miniaturizing the matching network so that the masses to be moved can be kept as small as possible so as to expend as little energy as possible.

SUMMARY OF THE INVENTION

The present invention is therefore directed toward providing configurations for the matching network which achieve a maximum of bandwidth with a minimum number of components. In particular, a bandwidth of $f_o/2$ should be possible for a ZnO transmitter.

According to the invention, this object is achieved through the provision of matching networks for piezoelectric transmitters of the type initially mentioned, accomplished by selecting the circuit as a function of the reactance of the transmitter. Advantageous dimension values for the components of the matching networks are selected in a similar manner. A circuit containing components having these selected values can be implemented in particularly advantageous manner at frequencies $f_o$ which are in the gigahertz range in accordance with a further aspect of the invention.

Specifically, the present invention encompasses three circuits used alternately depending upon the reactance $X_o$ of the piezoelectric transmitter. Where this reactance is not greater than 50 ohms, the signal-conducting line is connected to the electrode of the transmitter through a series combination of a capacitor and an inductor. Moreover, the electrode is also connected through a second inductor to ground. When the reactance is between 50 and 250 ohms, the signal-conducting line is connected to the electrode through an inductor. The signal conducting line is also connected to ground through a parallel combination of a capacitor and a second inductor. Finally, when the reactance is greater than 250 ohms, the signal conducting line is connected to the electrode through a series combination of an impedance and an inductor. Approximate values for the capacitors, inductors, and impedance are defined in accordance with the capacitance and reactance of the piezoelectric transmitter and the center frequency of the signal being transmitted.

BRIEF DESCRIPTION OF THE DRAWINGS

These and other features and advantages of the present invention will be more clearly understood from the following written description read in conjunction with the drawings, in which.

DETAILED DESCRIPTION OF THE PREFERRED EMBODIMENTS

Figure 1:
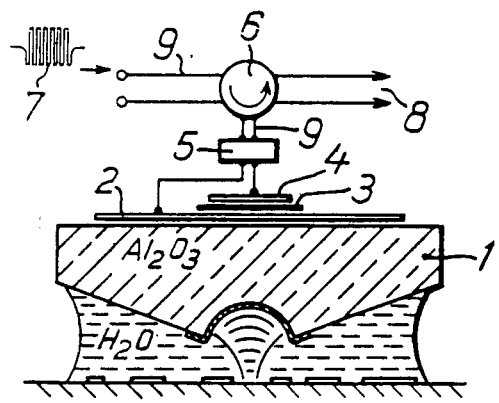
FIG. 1 shows an acoustic lens arrangement known per se.

FIG. 1 shows an acoustic lens arrangement as used in acoustical reflection microscopy. On a plane surface of a sapphire rod 1 a piezoelectric transmitter is mounted which consists of a first gold layer 2, a ZnO layer 3 sputtered thereon and of a second gold layer 4. The two gold layers 2 and 4 are connected to the matching network 5 in which arrangement the gold layer 4 is the active electrode of the transmitter. The gold layer 2 is connected to ground potential.

The matching network 5 is preceded by a circulator 6 which, during a first period, passes the signal 7 coming from a generator to the transmitter and, in a second period, blocks this signal and passes the measurement signal coming from the transmitter to the output lines 8. The signal-conducting line is designated by 9.

The capacitance $C_o$ of the transmitter can be determined on the basis of the known area A, the thickness d and the dielectric constant $\epsilon$ of the piezoelectric layer 3:

$$C_o = (\epsilon \cdot A)/d$$

For an intended center frequency $f_o$ of the frequency band to be transmitted, the reactance $X_o$ is then found as:

$$X_o = \frac{1}{2\pi f_o} \cdot \frac{1}{C_o}$$

Figure 2:
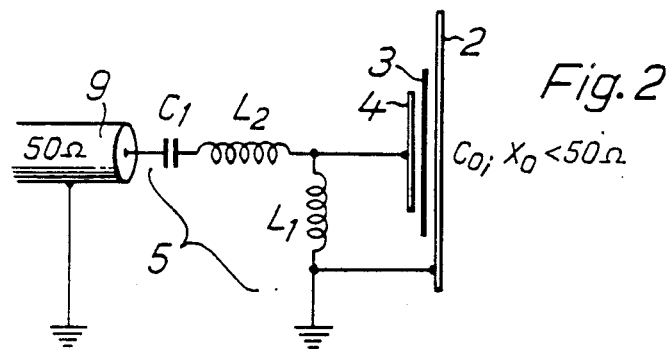
FIG. 2 shows the equivalent circuit for obtaining a match to a transmitter having a reactance of $X_o$ less than 50 ohms.

The matching network shown in FIG. 2 is particularly suitable for a transmitter reactance $X_o$ less than 50 ohms. In this arrangement, the circuit elements $L_1$, $C_1$ and $L_2$ have approximately the followng values:

$$L_1 \simeq \frac{1}{(2\pi f_o)^2} \cdot \frac{1}{C_o} \; ; \; C_1 \simeq \frac{1}{5} \cdot C_o; \; L_2 \simeq \frac{1}{(2\pi f_o)^2} \cdot \frac{1}{C_1}$$

At frequencies in the GHz range, this network can be implemented by connecting two connecting wires to the active electrode 4 of the transmitter. One of these wires is connected to ground to form the inductance $L_1$ and the other one is connected to a chip capacitor $C_1$ to form the inductance $L_2$. At a center frequency $f_o = 1$ GHz, this matching network can be used for a frequency range from about 750 MHz to 1,250 MHz. This is a range which is preferred for acoustical microscopy. If transmitters having a reactance $X_o$ of less than 50 ohms are used, this makes it possible to construct acoustic lens arrangements, the geometric dimensions of which are only determined by mechanical holder parts and electric connecting elements.

Figure 2A:
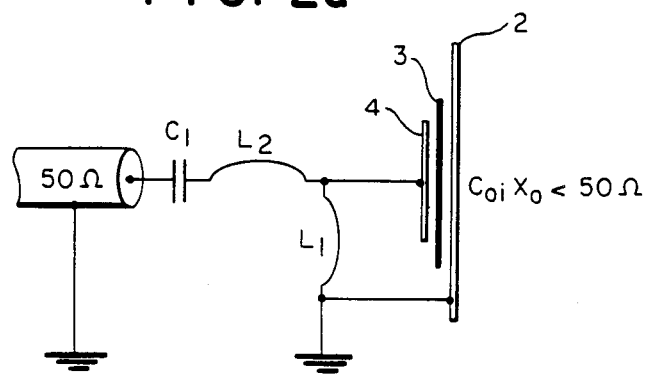
FIG. 2a shows an alternate embodiment of the invention of FIG. 2.

An alternate embodiment of the invention is shown in FIG. 2a wherein the inductors $L_1$ and $L_2$ comprise wires.

Figure 3:
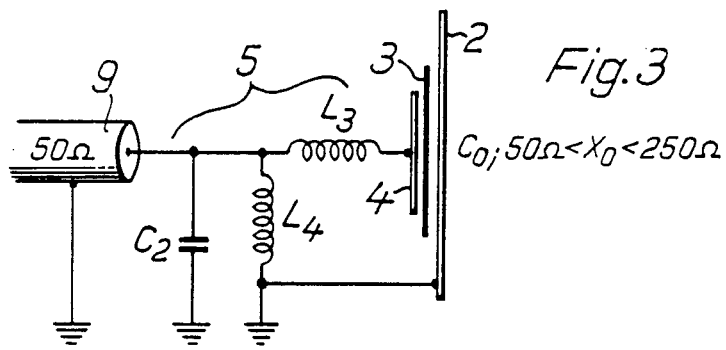
FIG. 3 shows the equivalent circuit at a reactance of $X_o$ which is between 50 and 250 ohms inclusive.

The matching network shown in FIG. 3 is particularly advantageous for a reactance range of from 50 to 250 ohms. In this arrangement, the circuit elements $L_3$, $C_2$ and $L_4$ have approximately the following values:

$$L_3 \simeq \frac{1}{(2\pi f_o)^2} \cdot \frac{1}{C_o} \; ; \; C_2 \simeq 5 \cdot C_o; \; L_4 \simeq \frac{1}{(2\pi f_o)^2} \cdot \frac{1}{C_2}$$

Figure 3A:
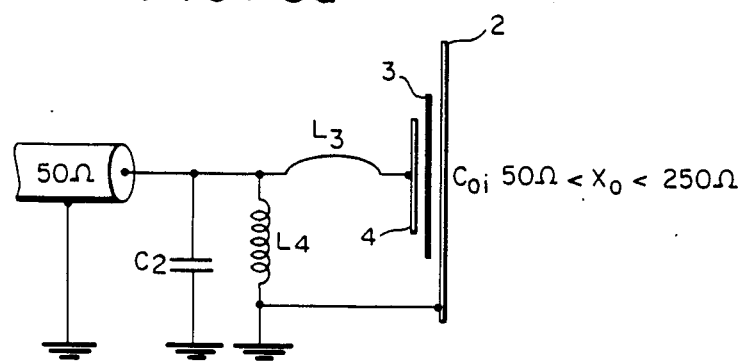
FIG. 3a shows an alternate embodiment of the invention of FIG. 3.

Here too, for frequencies in the GHz range, a possibility for implementation is created which simplifies considerably the geometric configuration of the matching network. This is because $L_3$ can be fabricated by appropriately choosing the length of the connecting wire to the active electrode 4 of the transmitter in a manner which will be apparent to one having ordinary skill in the art. Such an arrangement of a wire inductor is shown in FIG. 3a.

Figure 4:
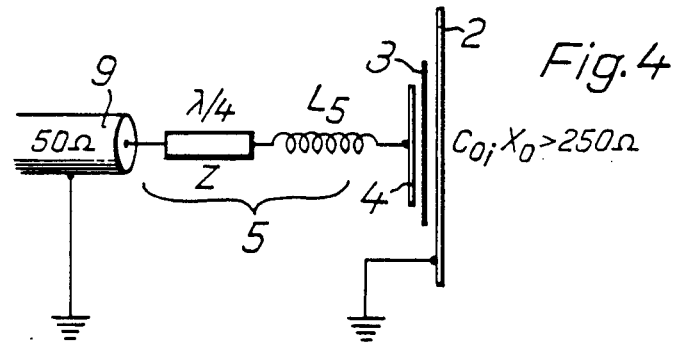
FIG. 4 shows the equivalent circuit at a reactance of $X_o$ greater than 250 ohms.

The matching network, shown in FIG. 4, for transmitter reactances of $X_o$ greater than 250 ohms uses circuit elements having approximately the following values:

$$L_5 = \frac{1}{(2\pi f_o)^2} \cdot \frac{1}{C_o} \; ; \; Z = \frac{1}{5} \cdot X_o$$

The geometric dimensions of this network are essentially determined by the necessary impedance Z which is usually formed by a strip waveguide the length of which is a quarter of the wavelength $\lambda$ at the center frequency $f_o$.

What is claimed is:

1. A wide band network comprising means for matching the impedance of a signal-conducting line having a characteristic impedance of about 50 ohms to an electrode, a piezoelectric transmitter having said electrode as a part thereof, said transmitter having an equivalent ohmic resistance $R_\Omega$ series with an equivalent capacitance $C_o$, the resistance $R_\Omega$ being approximately one-tenth of the reactance of said capacitance $C_o$, and a reactance $X_o$ not greater than about 50 ohms at a center frequency $f_o$ of the frequency band of signals to be transmitted and said matching means comprising:
   a series combination of a first capacitor having capacitance $C_1$ and a second inductor having an inductance $L_2$ connecting said signal-conducting line to said electrode; and
   a first inductor having an inductance $L_1$ connecting said electrode to ground;
   wherein the values $C_1$, $L_1$, and $L_2$ are determined approximately by the following relationships:

$$C_1 \simeq \frac{1}{5} C_o$$

$$L_1 \simeq \frac{1}{(2\pi f_o)^2} \frac{1}{C_o}$$

$$L_2 \simeq \frac{1}{(2\pi f_o)^2} \frac{1}{C_1}.$$

2. A wide band network as claimed in claim 1, wherein, for $f_o$ greater than about 1 GHz, said first and second inductors respectively comprise wires attached to said electrode, and said first capacitor comprises a chip capacitor.

3. A wide band network for matching the impedance of a signal-conducting line having a characteristic impedance of about 50 ohms to an electrode of a piezoelectric transmitter, said transmitter having an equivalent ohmic resistance $R_\Omega$ in series with an equivalent capacitance $C_o$, the resistance $R_\Omega$ being approximately one-tenth of the reactance of said capacitance $C_o$, and a reactance $X_o$ between about 50 to 250 ohms at a center frequency $f_o$ of the frequency band of signals to be transmitted, comprising:
   a first inductor having an inductance $L_3$ connecting said signal-conducting line to said electrode;
   a first capacitor having a capacitance $C_2$ connecting said signal-conducting line to ground; and
   a second inductor having an inductance $L_4$ connected in parallel with said first capacitor and also connecting said signal-conducting line to ground;
   wherein the values $C_2$, $L_3$, and $L_4$ are determined approximately by the following relationships:

$$C_1 \simeq 5 \cdot C_o$$

$$L_3 \simeq \frac{1}{(2\pi f_o)^2} \frac{1}{C_o}$$

$$L_4 \approx \frac{1}{(2\pi f_o)^2} \cdot \frac{1}{C_2}.$$

4. A wide band network as claimed in claim 3 wherein, for $f_o$ greater than about 1 GHz, said first inductor comprises a wire.

5. A wide band network comprising means for matching the impedance of a signal-conducting line having a characteristic impedance of about 50 ohms to an electrode, a piezoelectric transmitter having said electrode as a part thereof, said transmitter having an equivalent ohmic resistance $R_\Omega$ in series with an equivalent capacitance $C_o$, the resistance $R_\Omega$ being approximately one-tenth of the reactance of said capacitance $C_o$, and a reactance $X_o$ not less than about 250 ohms at a center frequency $f_o$ of the frequency band of signals transmitted, and said matching means comprising a series combination of a $\lambda/4$ length impedance line having a characteristic impedance Z and an inductor having an inductance $L_5$ for connecting said signal-conducting line to said electrode, where $\lambda$ is the signal wavelength at center frequency $f_o$;

wherein the values Z and $L_5$ are determined approximately by the following relationships:

$$Z \approx \frac{1}{5} X_o$$

$$L_5 \approx \frac{1}{(2\pi f_o)^2} \cdot \frac{1}{C_o}.$$

* * * * *